United States Patent
Cadee et al.

(10) Patent No.: US 9,921,494 B2
(45) Date of Patent: Mar. 20, 2018

(54) LITHOGRAPHIC APPARATUS COMPRISING AN ACTUATOR, AND METHOD FOR PROTECTING SUCH ACTUATOR

(71) Applicant: ASML Netherlands B.V., Veldhoven (NL)

(72) Inventors: Theodorus Petrus Maria Cadee, Asten (NL); Sander Christiaan Broers, Weert (NL); Sven Antoin Johan Hol, Eindhoven (NL); Yang-Shan Huang, Veldhoven (NL); Antonius Franciscus Johannes De Groot, Someren (NL); Bastiaan Lambertus Wilhelmus Marinus Van De Ven, Rosmalen (NL)

(73) Assignee: ASML NETHERLANDS B.V., Veldhoven (NL)

( * ) Notice: Subject to any disclaimer, the term of this patent is extended or adjusted under 35 U.S.C. 154(b) by 69 days.

(21) Appl. No.: 14/395,454

(22) PCT Filed: Apr. 12, 2013

(86) PCT No.: PCT/EP2013/057659
§ 371 (c)(1),
(2) Date: Oct. 17, 2014

(87) PCT Pub. No.: WO2013/160123
PCT Pub. Date: Oct. 31, 2013

(65) Prior Publication Data
US 2015/0070678 A1     Mar. 12, 2015

Related U.S. Application Data

(60) Provisional application No. 61/639,522, filed on Apr. 27, 2012.

(51) Int. Cl.
*G03B 27/58* (2006.01)
*G03F 7/20* (2006.01)

(52) U.S. Cl.
CPC .......... *G03F 7/70766* (2013.01); *G03F 7/709* (2013.01); *G03F 7/70533* (2013.01); *G03F 7/70758* (2013.01)

(58) Field of Classification Search
CPC ............. G03F 7/70533; G03F 7/70525; G03F 7/70691; G03F 7/70716; G03F 7/70725;
(Continued)

(56) References Cited

U.S. PATENT DOCUMENTS 6,449,030 B1   9/2002   Kwan
6,583,597 B2   6/2003   Tanaka et al.
(Continued)

FOREIGN PATENT DOCUMENTS

EP    1 372 035       12/2003
JP    2001-110699     4/2001
(Continued)

OTHER PUBLICATIONS

International Search Report and Written Opinion dated Jul. 2, 2013 in corresponding International Patent Application No. PCT/EP2013/057659.

(Continued)

*Primary Examiner* — Christina Riddle
(74) *Attorney, Agent, or Firm* — Pillsbury Winthrop Shaw Pittman LLP (57) ABSTRACT

A lithographic apparatus comprises a system. The system comprises a first part, a second part and an energy absorbing element. The second part is configured to move relatively to the first part. The system has a gap located between the first part and the second part during an operation mode of the system. The energy absorbing element is for absorbing energy between the first part and the second part when the
(Continued)

first part and the second part crash onto each other in a failure mode of the system. The energy absorbing element is outside the gap.

13 Claims, 11 Drawing Sheets

(58) Field of Classification Search
CPC ............ G03F 7/70758; G03F 7/70766; G03F 7/70775; G03F 7/70816; G03F 7/70983; G03F 7/709
USPC .............. 355/27–77, 52, 53, 55; 250/442.11, 250/492.2, 492.22, 493.1, 548
See application file for complete search history.

(56) References Cited

U.S. PATENT DOCUMENTS

| | | | |
|---|---|---|---|
| 6,635,887 B2 | 10/2003 | Kwan et al. | |
| 6,794,660 B2* | 9/2004 | Watson | G02B 21/26 250/442.11 |
| 6,891,600 B2 | 5/2005 | Frissen et al. | |
| 7,084,532 B2* | 8/2006 | Widdowson | H02K 41/031 310/12.05 |
| 7,184,121 B2 | 2/2007 | Van Der Meulen et al. | |
| 7,310,132 B2 | 12/2007 | Van Der Schoot et al. | |
| 2001/0004105 A1* | 6/2001 | Kwan | G03F 7/70716 250/492.2 |
| 2001/0006762 A1* | 7/2001 | Kwan | G03F 7/70716 430/311 |
| 2001/0050341 A1* | 12/2001 | Kwan | G03F 7/70716 250/491.1 |
| 2001/0052970 A1* | 12/2001 | Sato | G03F 7/70825 355/72 |
| 2002/0048009 A1 | 4/2002 | Kwan | |
| 2003/0169409 A1* | 9/2003 | Nishi | G03F 7/70716 355/51 |
| 2004/0031932 A1* | 2/2004 | Vosters | G03F 7/70716 250/492.1 |
| 2004/0036848 A1 | 2/2004 | Frissen et al. | |
| 2005/0007574 A1* | 1/2005 | Van Der Meulen | G03F 7/70716 355/72 |
| 2005/0218335 A1 | 10/2005 | Kimura et al. | |
| 2008/0060828 A1* | 3/2008 | Shibazaki | G03F 7/70716 174/5 SG |
| 2010/0265487 A1 | 10/2010 | Smeets | |

FOREIGN PATENT DOCUMENTS

| | | |
|---|---|---|
| JP | 2002-025902 | 1/2002 |
| JP | 2002-057091 | 2/2002 |
| JP | 2004-343120 | 12/2004 |
| JP | 2007-163451 | 6/2007 |
| JP | 2008-061493 | 3/2008 |
| JP | 2011-244608 | 12/2011 |

OTHER PUBLICATIONS

Japanese Office Action dated Dec. 7, 2015 in corresponding Japanese Patent Application No. 2015-507460.

* cited by examiner

LITHOGRAPHIC APPARATUS COMPRISING AN ACTUATOR, AND METHOD FOR PROTECTING SUCH ACTUATOR

CROSS-REFERENCE TO RELATED APPLICATIONS

This application is the U.S. national phase entry of International Patent Application No. PCT/EP2013/057659, filed Apr. 12, 2013, which claims the benefit of priority from US provisional application 61/639,522, which was filed on Apr. 27, 2012, and which is incorporated herein in its entirety by reference.

FIELD

The present invention relates to a lithographic apparatus comprising an actuator, and a method for protecting such actuator.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Lithographic apparatus may have actuators which exert a force between a first part provided with a stator, and a second part provided with a mover. There may be a gap between the stator and the mover. During a failure of the apparatus, there is a risk that the mover may crash on the stator.

SUMMARY

It is desirable to provide a system with a crash protection in a lithographic apparatus.

According to an embodiment of the invention, there is provided a lithographic apparatus comprising a system. The system comprises a first part, a second part and an energy absorbing element. The second part is configured to move relatively to the first part. The system has a gap located between the first part and the second part during an operation mode of the system. The energy absorbing element is for absorbing energy between the first part and the second part when the first part and the second part crash onto each other in a failure mode of the system. The energy absorbing element is outside the gap.

In another embodiment of the invention, there is provided a method for protecting an actuator of a lithographic apparatus from a crash. The actuator has a stator and a mover so as to generate a force between the stator and the mover. The lithographic apparatus comprises a first part and a second part configured to move relatively to the first part. The first part comprises the stator, a first body and an energy absorbing element between the stator and the first body. The second part comprises the mover. The lithographic apparatus has a gap located between the stator and the mover in an operation mode. The method comprises crashing the stator and the mover onto each other in a failure mode, and absorbing energy with the energy absorbing element by moving the stator relative to the first body.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
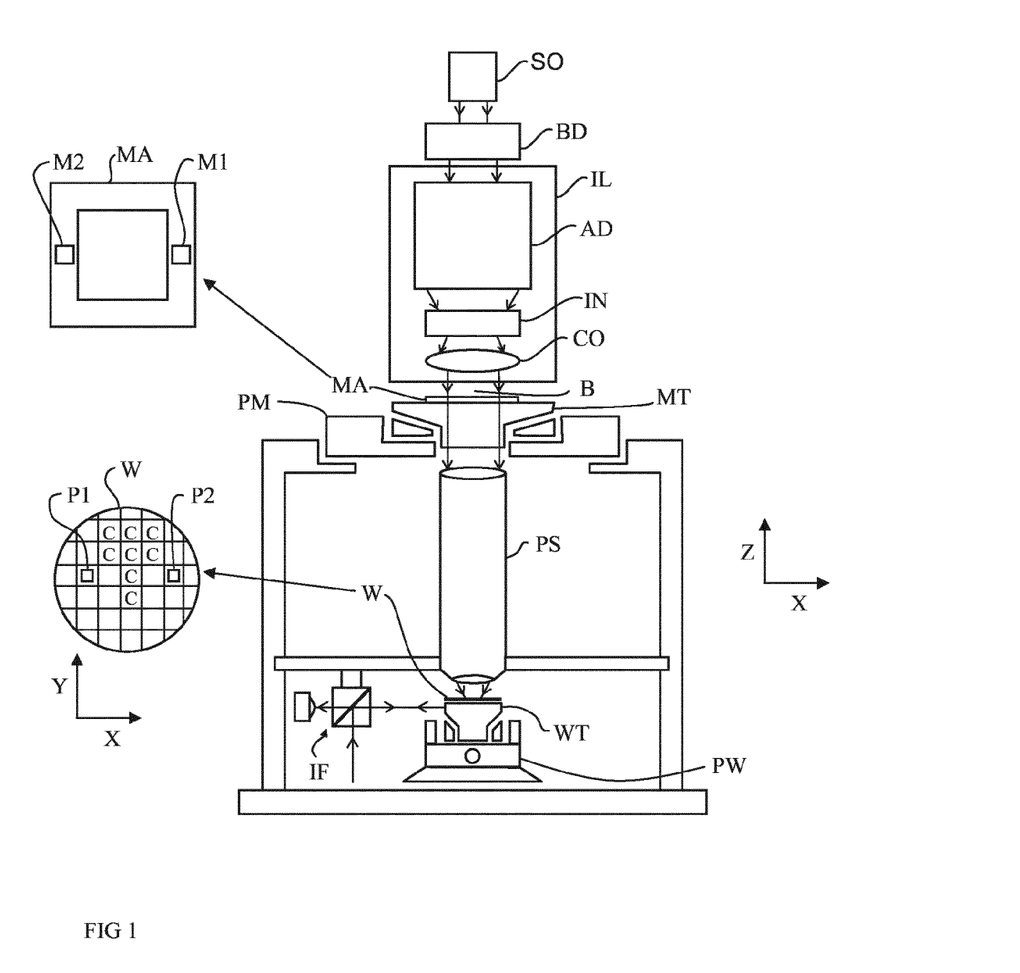
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable minor array employs a matrix arrangement of small minors, each of which can be individually tilted so as to reflect an incoming radiation beam in different directions. The tilted mirrors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL to may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a patterning device library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
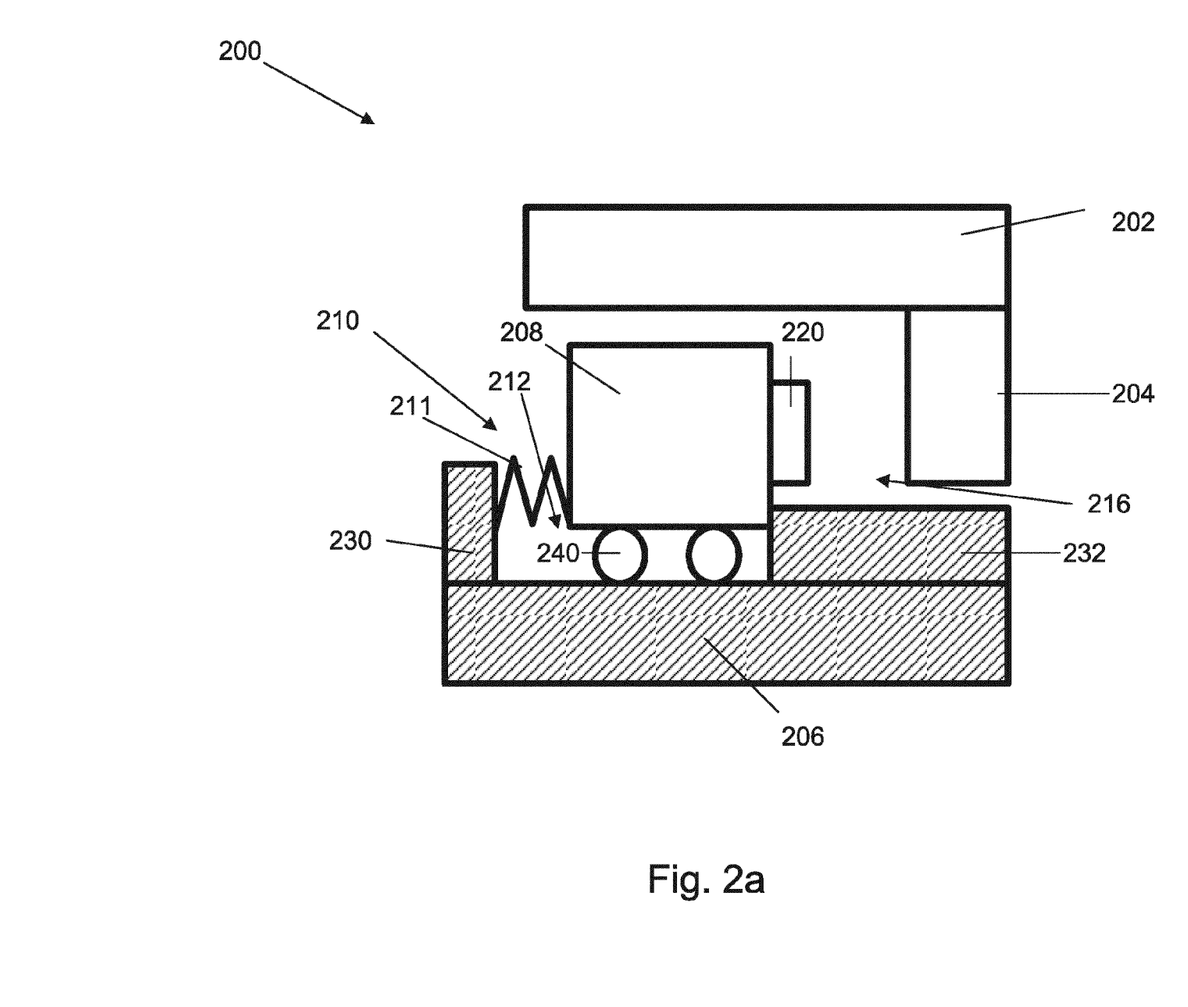
FIGS. 2a-2c depict an actuator for a lithographic apparatus according to an embodiment of the invention.
Figure 2B:
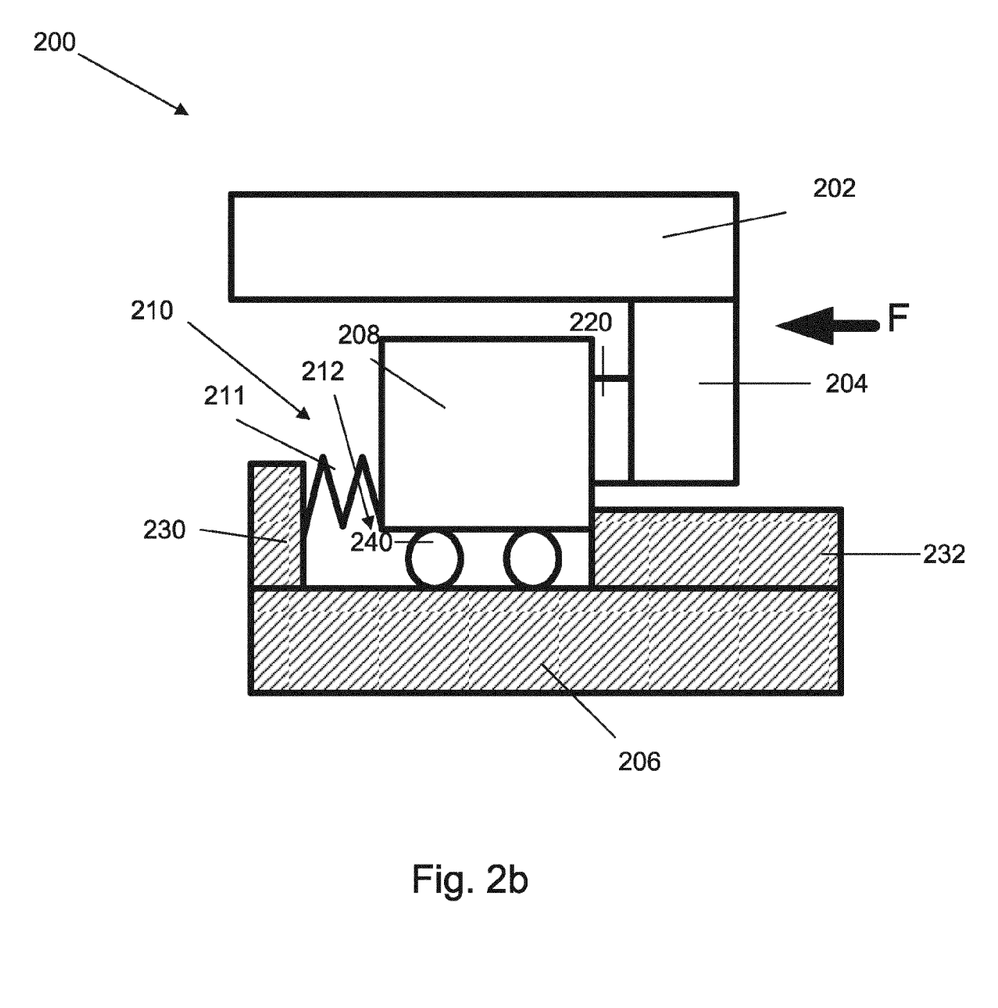
Figure 2C:
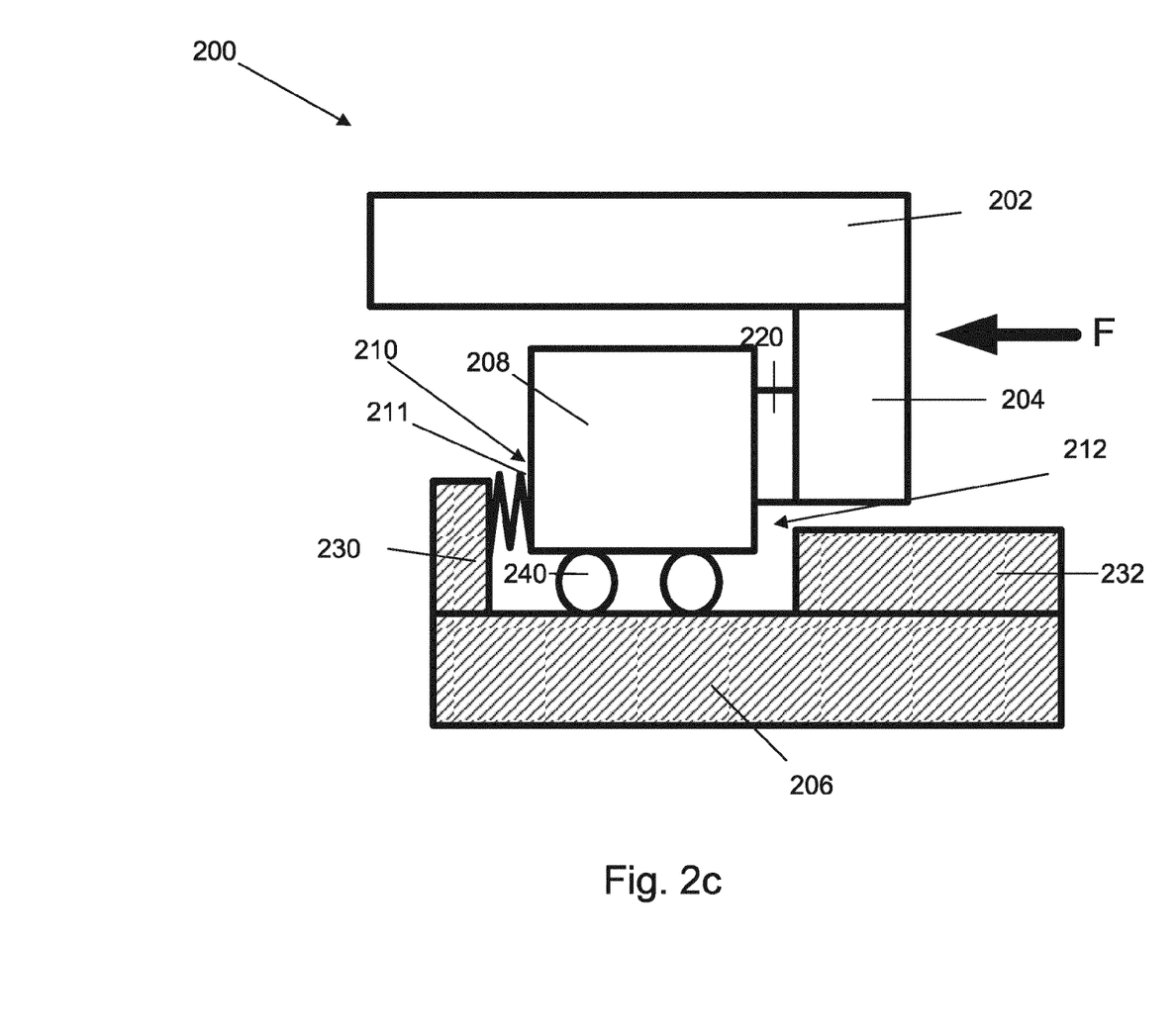

FIGS. 2a-2c show a system 200 for a lithographic apparatus according to an embodiment of the invention. The system 200 may comprise an actuator. In FIG. 2a, the actuator 200 of the lithographic apparatus is in an operation mode. In the operation mode, the lithographic apparatus may be able to perform at least part of a lithographic process. The operation mode may include exposing a substrate, taking measurements required for the lithographic process, or positioning a substrate relative to the projection system. The operation mode may include moving the mover relative to the stator in a desired way, for example according to a desired setpoint. The actuator 200 may comprise a first part provided with a stator 208, a second part provided with a mover 204, and an energy absorbing element 210. The first part may be a long stroke stage part 206 and the second part may be a short stroke stage part 202. The stator 208 may comprise a first side having a contact portion 220. The contact portion 220 may comprise a pad, and/or a sensor and a flux sensor coil. A gap 216 may be formed between the stator 208 and the mover 204. The energy absorbing element 210 may comprise a (e.g. pre-tensed) spring 211 and/or a damper (not shown in FIGS. 2a-2c). The energy absorbing element 210 may be any suitable type of element that is able to absorb energy temporarily or permanently.

The long stroke stage part 206 may extend in a longitudinal direction substantially parallel to the short stroke stage part 202. The long stroke stage part 206 and the short stroke stage part 202 may be located in either the first positioning device PM or the second positioning device PW or both (see FIG. 1). The long stroke stage part 206 may comprise an adjustment element 232 and a pedestal 230. A recess 212 is formed by the adjustment element 232 and the pedestal 230.

The mover 204 may be attached to the short stroke stage part 202. The stator 208 may be partially located inside the recess 212 of the long stroke stage part 206. The energy absorbing element 210 may be with one end attached to a side of the stator 208 other than the first side of the stator 208, and may be with the other end attached to the pedestal 230. The pedestal 230 may be any type of body that is part of the first part, for example a separate body mounted on the long stroke part 206 or integrated with the long stroke part 206. The energy absorbing element 210 may extend in a longitudinal direction substantially parallel to the short stroke stage part 202 and the long stroke stage part 206. The stator 208 may be movable relative to the pedestal 230, for example slidably movable, in the recess 212 by a guiding element 240. Alternatively, the recess 212 may be omitted. The pedestal 230 may provide sufficient stiffness for the energy absorbing element 210 when the mover 204 is moved against the stator 208 with a certain speed. The adjustment element 232 may be contacted with the first side of the stator 208. The adjustment element 232 may provide sufficient stiffness for the stator 208 to hold the stator 208 at a predetermined position with respect to the pedestal 230. The adjustment element 232 may be used to set a nominal gap between the mover 204 and the stator 208. The nominal gap may be set at a size at which the actuator has a high efficiency. The guiding element 240 may guide the deformation of the energy absorbing element 210 and/or the movement of the stator 208 in a predetermined direction when the mover 204 is crashed onto the stator 208. Additional or alternatively to the energy absorbing element 210, a separate energy absorbing element may be provided (not shown in FIG. 2a-2c). This separate energy absorbing element may be located on any suited location to absorb energy between the long stroke part 206 and the short stroke part 202 if they collide together.

In an embodiment, the guiding element may comprise a cross-roller guide, one or more struts that allow Rz rotation, a leaf spring, a contact ball and/or an element with pretention capability. The guiding element may also be a sliding contact element. The stator 208 may be slidably coupled to the sliding contact element. When the mover 204 is crashed onto the stator 208, the stator 208 may be slidably movable on the sliding contact element. The guiding element may alternatively comprise a hinge that allows the stator to rotate with respect to the pedestal 230.

In an embodiment, the energy absorbing element 210 may be attached to a side of the stator 208 opposite to the first side of the stator 208.

In an embodiment, the contact portion 220 may be made of Teflon®.

In FIG. 2b, the actuator 200 of the lithographic apparatus is in a failure mode. The mover 204 may be moved relatively toward the stator 208 until it crashes on the stator 208. The crash may result in a force F in the direction of F as referred to in FIG. 2b. The mover 204 may contact the contact portion 220 of the stator 208 due to the relative movement between the mover 204 and the stator 208. The stator 208 may be movable, for example slidably movable, in the direction of F due to the force F of the mover 204. The damper of the energy absorbing element 210 may absorb the impact energy of the crash. The spring 211 may be contracted accordingly to transform the impact energy of the crash into an elastic potential energy so as to reduce the risk of deformation and/or damage of the stator 208.

In an embodiment, the spring 211 may be in a pre-tensed form so as to provide a pretension force to the stator 208. When the mover 204 is crashed onto the stator 208, the pretension force may (partly) compensate for the force F applied on the stator 208 during the crash. The energy absorbing element 210 may comprise an additional energy absorbing element other than the damper to absorb the impact energy of the crash. In an embodiment, the additional energy absorbing element may be a shock absorber. The shock absorber may be located on the long stroke stage part 206. A center of gravity/center of force (CoG/CoF) of the stator 208, the spring 211, the adjustment element 232 and the short stroke stage part 202 may be aligned along a same line parallel to the direction of F.

In FIG. 2c, during a failure mode of the lithographic apparatus, the spring 211 of the energy absorbing element 210 is contracted to a certain extend such that all the impact energy produced by the crash may be transformed to the potential energy of the spring 211. Therefore, the risk of deformation of the stator 208 during the failure mode of the lithographic apparatus may be reduced. Since the energy absorbing element 210 is located outside the gap 216, this may result in a reduced length of the gap 216 that enhances the force efficiency of the actuator 200.

In an embodiment, the energy absorbing element 210 may be interposed between two stators, or between the stator 208 and the recess 212 of the long stroke stage part 206 in a direction perpendicular to the longitudinal direction of the long stroke stage part 206.

The adjustment element 232 may also be functioning as a holding element configured to hold the stator 208 and/or the spring 211 at a certain position on the long stroke stage part 206.

Figure 3:
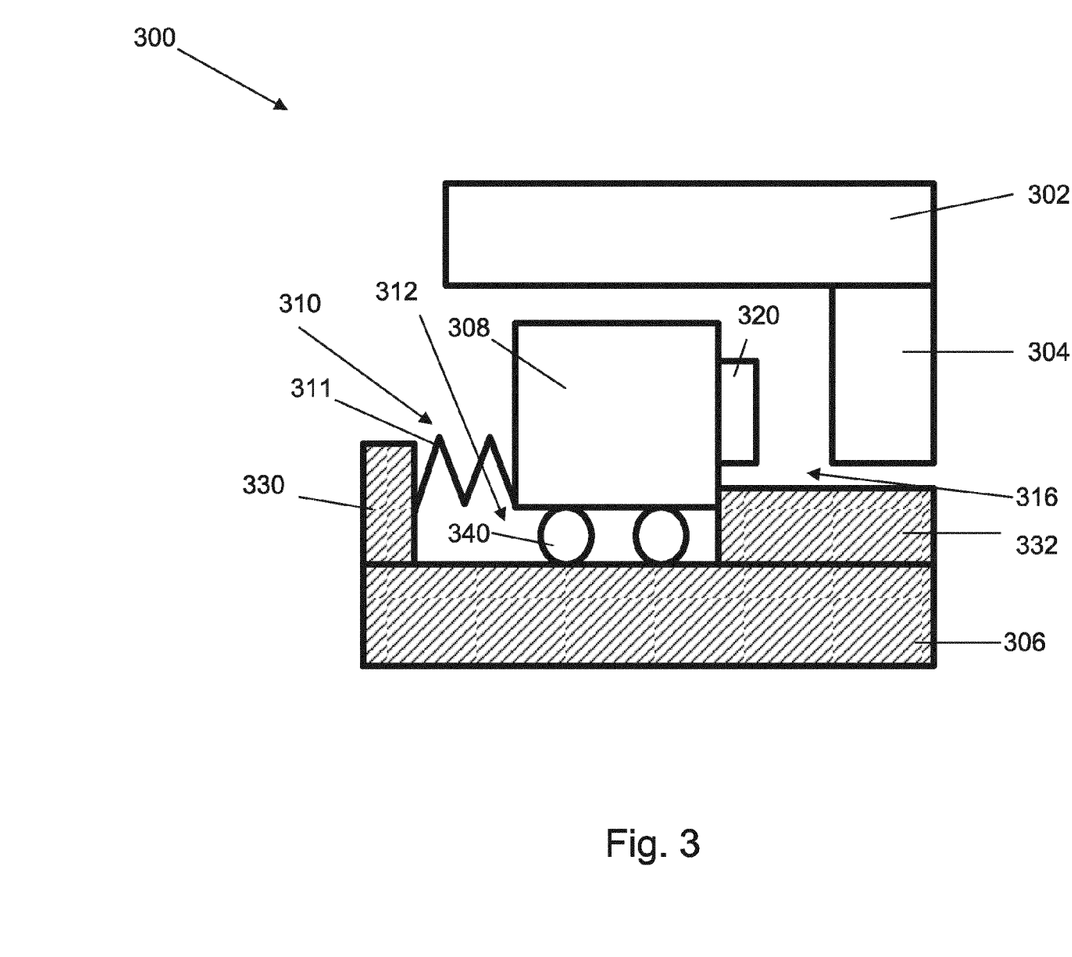
FIG. 3 depicts an actuator for a lithographic apparatus according to an embodiment of the invention.

FIG. 3 shows a system 300 for a lithographic apparatus according to an embodiment of the invention. The system 300 may be an actuator. In FIG. 3, the actuator 300 may comprise a first part provided with a stator 308, a second part provided with a mover 304, and an energy absorbing element 310. The first part may be a long stroke stage part 306 and the second part may be a short stroke stage part 302. The stator 308 may comprise a first side having a contact portion 320. The contact portion 320 may comprise a pad, a sensor, and/or a flux sensor coil. A gap 316 may be formed between the stator 308 and the mover 304. The energy absorbing element 310 may comprise a (e.g. pre-tensed) spring 311 and/or a damper (not shown in FIG. 3).

The long stroke stage part 306 may extend in a longitudinal direction substantially parallel to the short stroke stage part 302. The long stroke stage part 306 and the short stroke stage part 302 may be located in either the first positioning device PM or the second positioning device PW or both as depicted in FIG. 1. The long stroke stage part 306 may comprise an adjustment element 332 and a stiff pedestal 330. A recess 312 may be formed by the adjustment element 332 and the pedestal 330.

The mover 304 may be attached to the short stroke stage part 302. The energy absorbing element 310 may be with one end attached to a side of the stator 308 other than the first side of the stator 308, and may be with the other end attached to the pedestal 330. The energy absorbing element 310 may extend in a longitudinal direction substantially parallel to the short stroke stage part 302 and the long stroke stage part 306. The stator 308 may be movable, for example slidably movable, on the long stroke stage part 306 by a guiding element 340. The pedestal 330 may provide sufficient stiffness for the energy absorbing element 310. The stator 308 may be with the first side contacted with the adjusting element 332. The adjusting element 332 may have an elongated shape and may be attached to the long stroke stage part 306. The adjusting element 332 may be slidably moved to a first predetermined position along the long stroke stage part 306. The stator 308 may be slidably moved to a second predetermined position accordingly along the long stroke stage part 306. Thus the length of the gap 316 may be adjusted to a predetermined value with the adjusting element 332. The adjustment element 332 may provide sufficient stiffness for the stator 308. The guiding element 340 may guide the deformation of the energy absorbing element 310 and/or the movement of the stator 308 in a predetermined direction when the mover 304 is crashed onto the stator 308.

In an embodiment, the adjustment element 332 may contact a side of the stator 308 other than the first side of the stator 308.

In an embodiment, the adjusting element 332 may comprise a clamp configured to hold the stator 308 at a predetermined position on the long stroke stage part 306. The clamp may be a shear clamp, or a pin. The clamp may provide a friction force or a clamping force to the stator 308 which may (partly) compensate for a crash force F applied on the stator 308 during the crash. The adjusting element may comprise a rotary motor, a lead-screw and a contact element. The contact element may be connected to the rotary motor via the lead-screw. The contact element may contact the stator 308. By rotating the rotary motor, the stator 308 may be slidably moved to a predetermined position along the long stroke stage part 306. The adjusting element may further comprise a layer connected to the rotary motor via the lead-screw. The layer is parallel to the longitudinal direction of the long stroke stage part 306 and the short stroke stage part 302. The stator, the pedestal and the contact element may be located on the layer. A spring may be connected to both the pedestal and the stator. The contact element may contact the stator 308. By rotating the rotary motor, the stator 308 may be slidably moved to a predetermined position along the layer. The adjusting element may comprise a mechanical memory element to guide the stator 308 moving between a first predetermined position and a second predetermined position. The adjustment element 332 may be driven by different types of actuators, such as piezo-walk type actuator, inertial slider type actuator, lead-screw type actuator, rotary type actuator with reduction gear, magneto-restrictive type actuator, an inchworm type actuator, or any combination thereof. The different types of actuators may be arranged in series or parallel. The different types of the actuators of the adjustment element 332 may drive the stator 308 to a predetermined position. The actuators may also provide a clamping force to the stator 308.

Figure 4A:
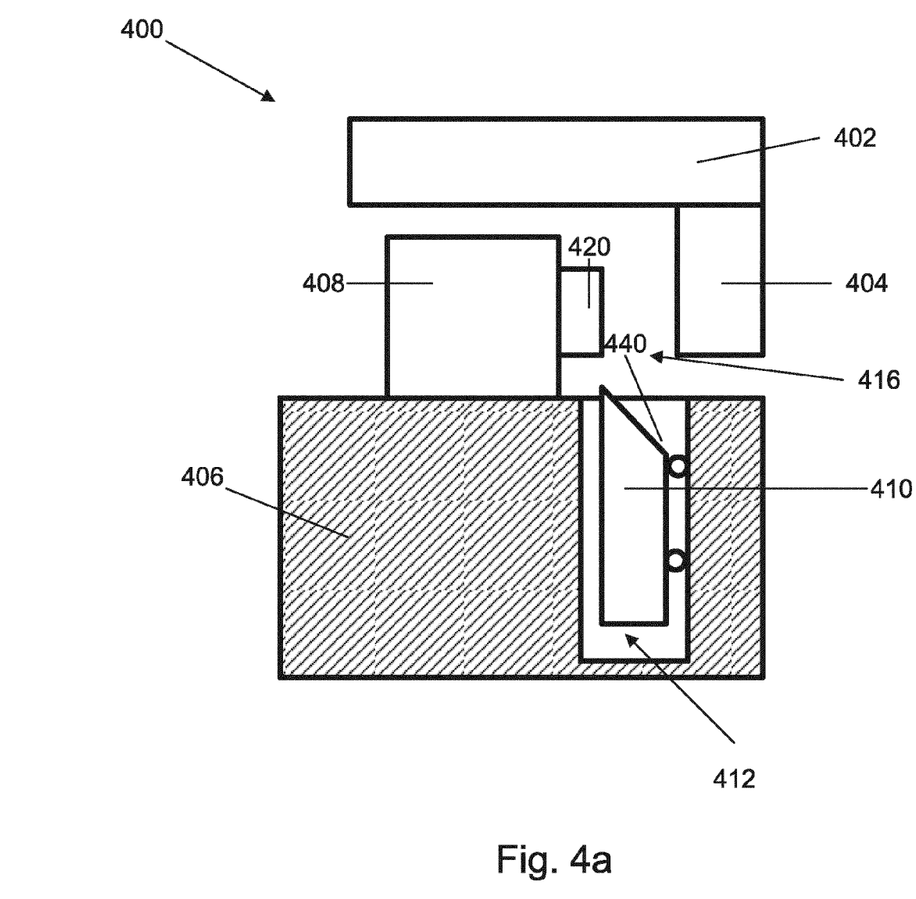
FIGS. 4a-4d depict an actuator for a lithographic apparatus according to an embodiment of the invention; and, FIGS. 5a-5b depict a cross-sectional view of a reluctance actuator for a lithographic apparatus according to an embodiment of the invention.

FIGS. 4a-4d shows a system 400 for a lithographic apparatus according to a further embodiment of the invention. The system 400 may comprise an actuator. In FIG. 4a, the actuator 400 of the lithographic apparatus works in an operation mode. The actuator 400 may comprise a first part provided with a stator 408, a second part provided with a mover 404, and a wedge 410. The first part may be a long stroke stage part 406 and the second part may be a short stroke stage part 402. The stator 408 may comprise a contact portion 420. The contact portion 420 may be a pad, a sensor, and/or a flux sensor coil. A gap 416 may be formed between the stator 408 and the mover 404.

The long stroke stage part 406 may extend substantially in a longitudinal direction parallel to the short stroke stage part 402. The long stroke stage part 406 and the short stroke stage part 402 may be located in either the first positioning device PM, the second positioning device PW, or both as depicted in FIG. 1. The long stroke stage part 406 may comprise a recess 412. The wedge 410 may be located inside the recess 412 when the lithographic apparatus works in an operation mode.

The mover 404 may be attached to the short stroke stage part 402. The stator 408 may be attached to the long stroke stage part 406. The wedge 410 may be movable, for example slidably movable, along an edge of the recess 412 in a direction substantially perpendicular to the short stroke stage part 402 and the long stroke stage part 406 via a guiding element 440. When the actuator 400 of the lithographic apparatus is in the operation mode, the wedge 410 may be held inside the recess 412 by a holding element (not shown in FIG. 4a).

Figure 4B:
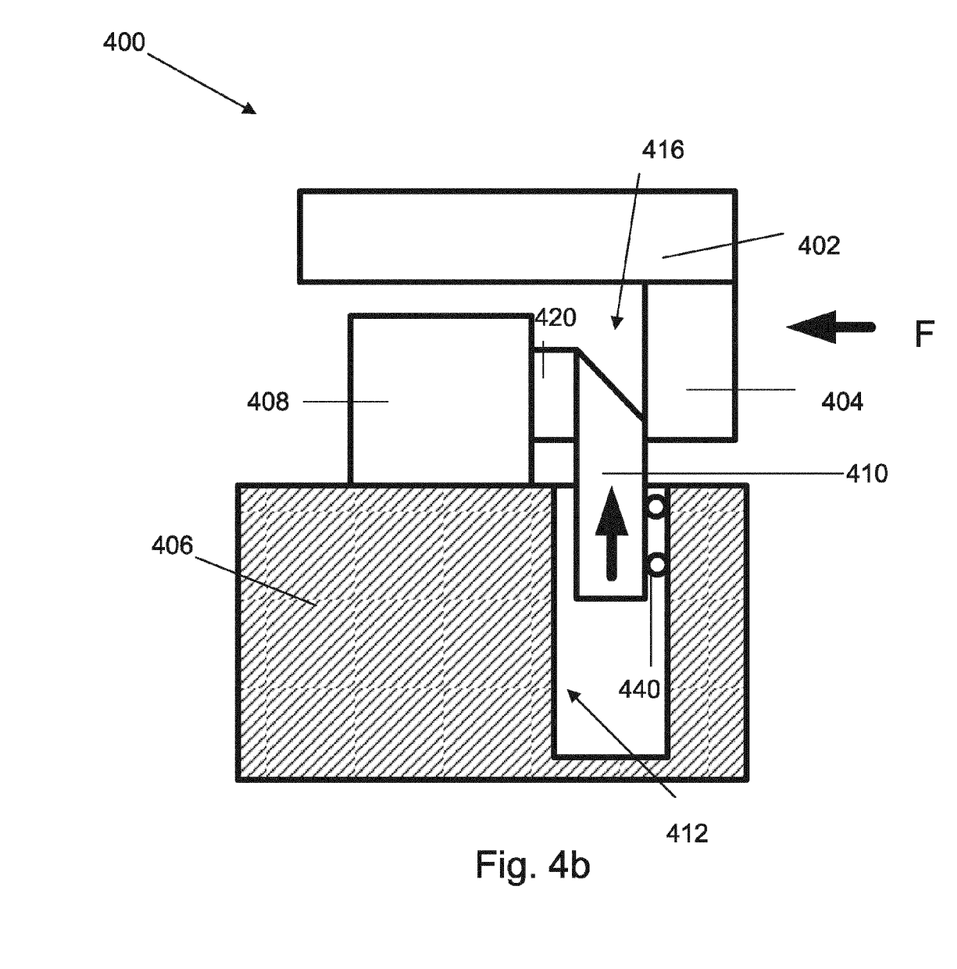

In FIG. 4b, the actuator 400 of the lithographic apparatus may be switched from an operation mode into a failure mode. The mover 404 may be moved relatively toward the stator 408 to crash on the stator 408. The crash may result in a force F in a direction of F as referred to in FIG. 4b. The wedge 410 may be automatically moved to a position interposed between the stator 408 and the mover 404 triggered by the mode change of the actuator 400 of the lithographic apparatus. The wedge may be made of a solid material. Since the size of the wedge 410 is relatively small and it is interposed between the stator 408 and the mover 404 only during the failure mode, there is no need for extra brake-path for designing the gap 416, the length of the gap 416 may therefore be reduced to the length of the wedge 410 between the mover 404 and the stator 408 during the failure mode. The intervention of the wedge 410 between the stator 408 and the mover 404 ensures that the velocity difference between the mover 404 and the stator 408 is reduced after the crash. Therefore, the impact force generated by the crash is reduced accordingly. The energy generated by the crash may be absorbed by an energy absorbing element (not shown in FIGS. 4a-4d), for example as disclosed in the embodiments described above. The holding element and the wedge 410 may work in a power failure mode, for example, when the lithographic device is powered off. This may further avoid the unexpected collision between the mover 404 and the stator 408 when the actuator 400 of the lithographic device is switched from an operation mode into a failure mode.

In an embodiment, the wedge 410 may be located outside the gap 416 when the actuator 400 is in an operation mode and the wedge 410 may be located inside the gap 416 when the actuator 400 is in a failure mode. The wedge 410 may be made of a material with high energy absorbing characteristics and/or characteristics that allow the wedge 410 to restore to original form after deformation. A top part of the wedge 410 may comprise a triangle-shaped portion. The top-angle of the triangle-shaped portion may be approximately at a 15 degree angle.

Figure 4C:
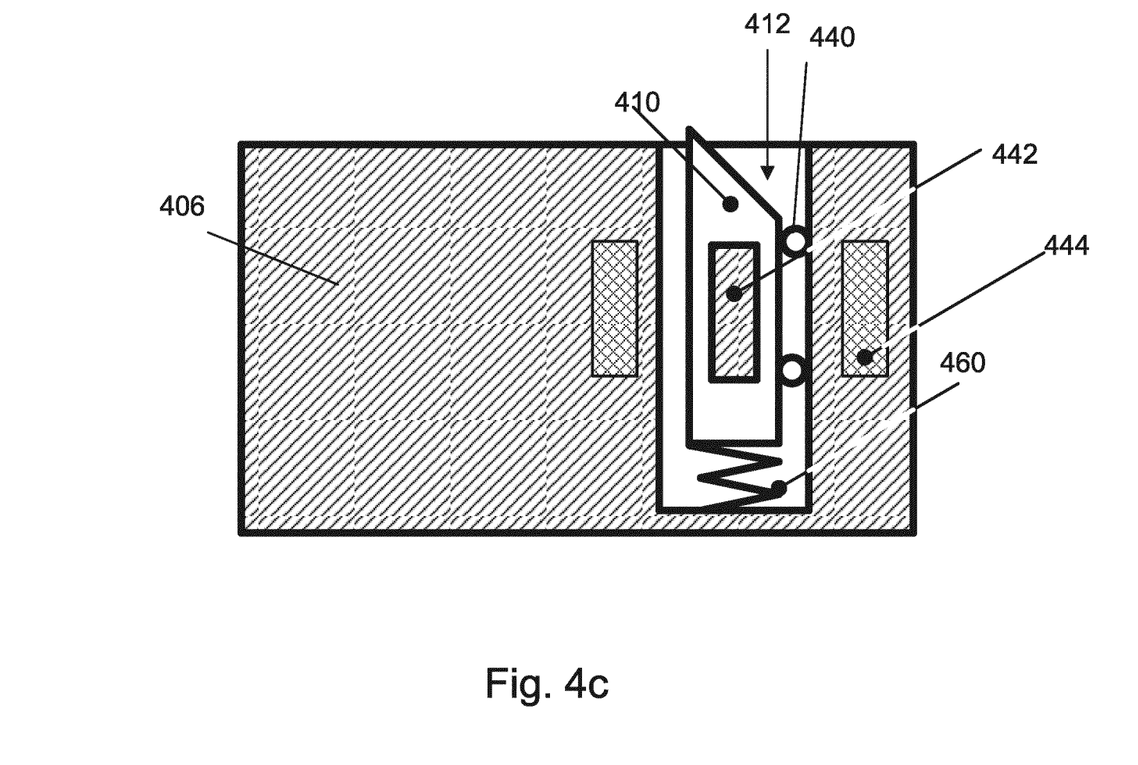

In FIG. 4c, the wedge 410 may be moved by a pre-tensioned spring 460 located inside the recess 412. The spring 460 may be with one end attached to the wedge 410 and may be with the other end attached to a bottom portion of the recess 412. The wedge 410 may be located above the spring 460. The wedge 410 may comprise a magnetic element 442. The long stroke stage part 406 may comprise one or more coils 444 circumferentially surrounding the magnet element 442. The coil 444 may be functioning as a holding element. When the lithographic apparatus is in an operation mode, the coil 444 may work as a magnetic actuator in response to the magnetic element 442 of the wedge 410. A holding force may be provided by the coil 444 to hold the wedge 410 at a position inside the recess 412. When the lithographic apparatus is in a failure mode, no current can be transmitted to any components of the apparatus. The coils 444 may be de-energized and the wedge 410 may be automatically pushed into the gap 416.

Figure 4D:
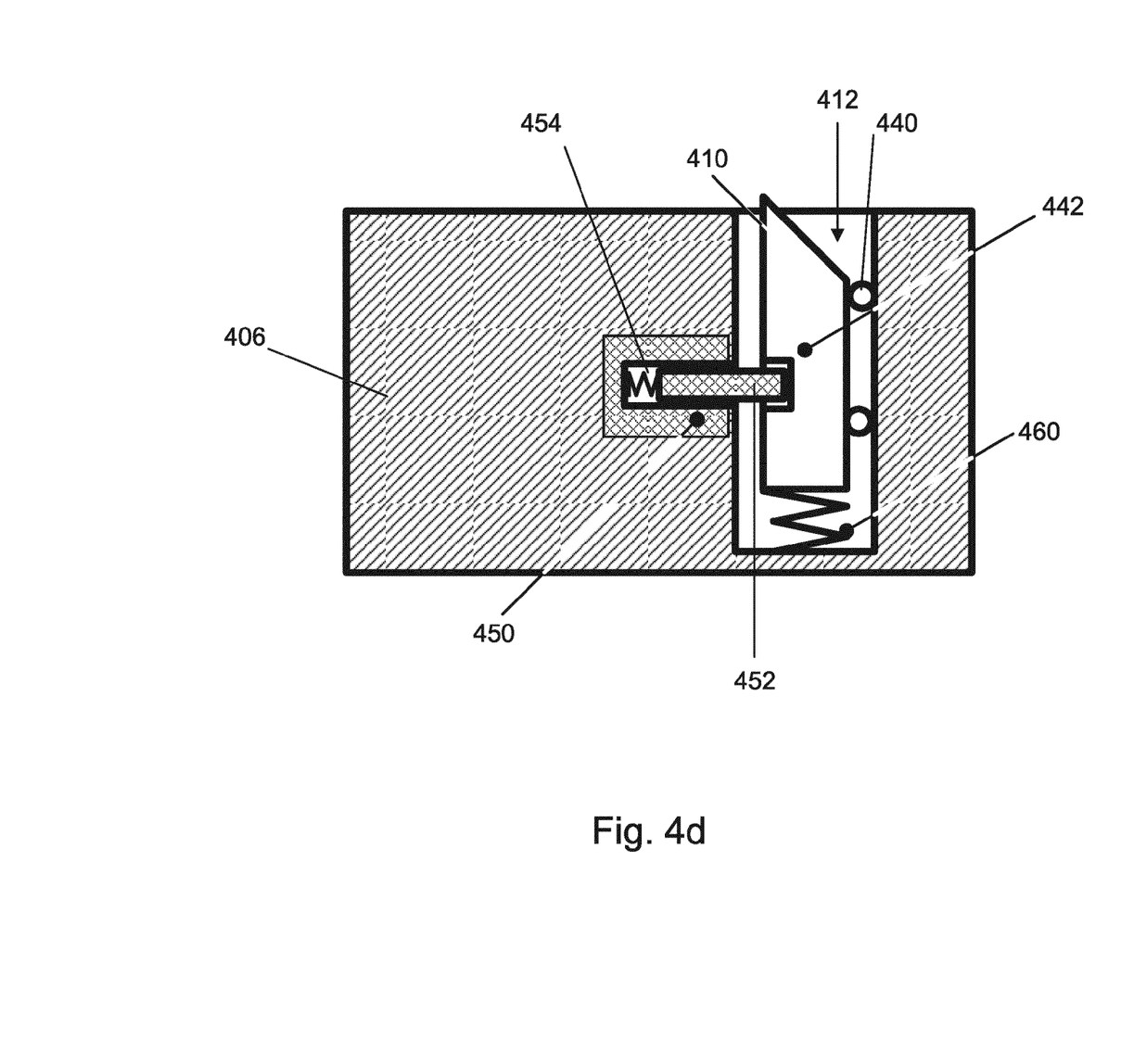

In FIG. 4d, the wedge 410 may be moved by a pre-tensioned spring 460 located inside the recess 412. The spring 460 may be with one end attached to the wedge 410 and may be with the other end attached to a bottom portion of the recess 412. The long stroke stage part 406 may comprise a solenoid element 450 located adjacent to the recess 412. The solenoid element 450 may comprise a bar-shaped element 452 inserted into the wedge 410 and a spring 454 connected to the bar-shaped element 452. When the actuator 400 of the lithographic device is in a failure mode, no current can be transmitted to any components of the apparatus. Thus the bar-shaped element 452 may be retracted out of the wedges 410 by the solenoid element 450, which results in that the wedge 410 may be automatically pushed into the gap 416.

In an embodiment, the actuator 400 may comprise a pneumatic actuator and a pre-loaded spring located inside the recess. The wedge 410 may be connected to the long stroke stage part 406 via the pre-loaded spring and the pneumatic actuator. The pneumatic actuator may be functioning as a retraction actuator that automatically retracts the wedge out of the gap 416 when the actuator of the lithographic apparatus is switched from a failure mode into an operation mode. In an embodiment, the wedge 410 may be connected to the long stroke stage part 406 through a spring which is made from bi-metal or shape memory alloy. This may simplify the design and/or the manufacturing process because no additional actuator is needed to retract the wedge 410.

In an embodiment, the energy absorbing element may further comprise a first part and a second part located outside the actuator gap for absorbing a part of the impact energy of the crash. The energy absorber may comprise a gas bag, e.g. air bag. The energy absorber may comprise a conventional shock absorber, an element made of a flexible material, for instance, visco-elastic material or rubber. The energy absorber may comprise an element made of Kevlar® fiber.

In an embodiment, the lithographic apparatus may further comprise an element having shear thickening fluid configured to reduce the relative velocity of the mover and the stator.

In an embodiment, the lithographic apparatus may further comprise a safety belt and a locking retractor. The safety belt may be connected to both the mover and the locking retractor in order to reduce the displacement of the mover relative to the short stroke stage part during the crash. Therefore, the impact force applied on the mover may be reduced during the crash.

Figure 5A:
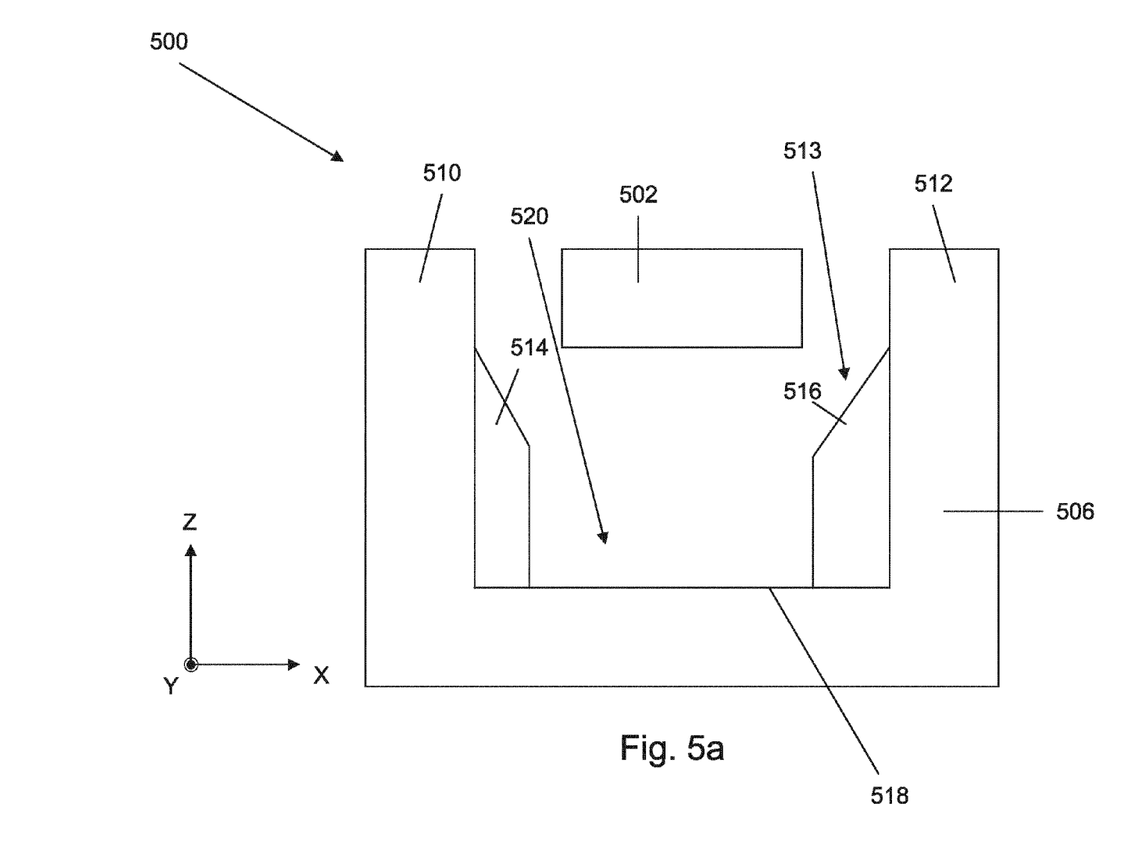
Figure 5B:
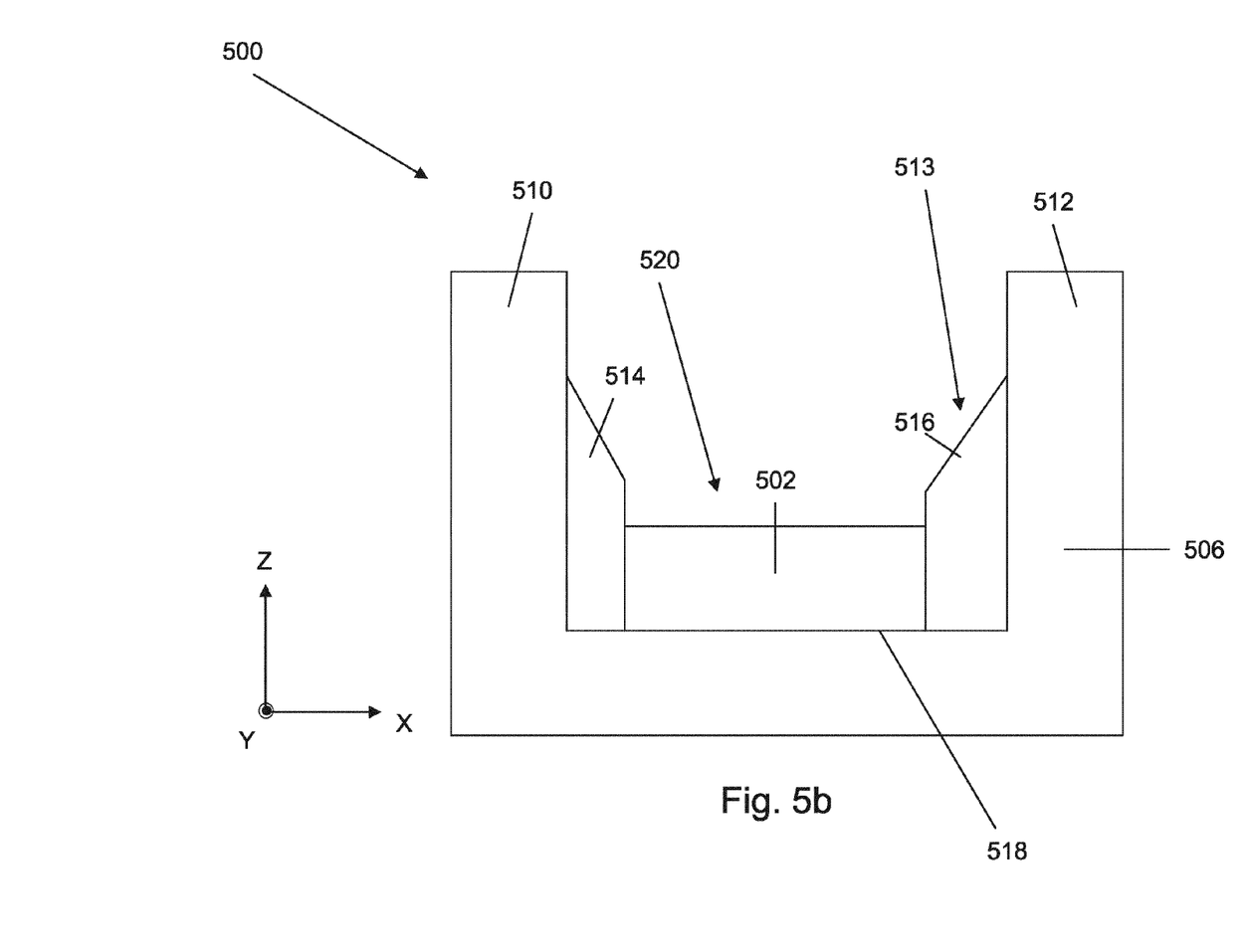

FIGS. 5a-5b shows a cross-sectional view of a system 500 for a lithographic apparatus according to an embodiment of the invention. The system 500 may be an actuator. In FIG. 5a, the actuator 500 may work in an operation mode. The actuator 500 may comprise a first part provided with a stator, and a second part provided with a mover (not shown in FIGS. 5a-5b). The first part may be a long stroke stage part 506 and the second part may be a short stroke stage part 502. A gap may be formed between the stator and the mover.

The long stroke stage part 506 and the short stroke stage part 502 may extend in a longitudinal direction substantially parallel to a Y-axis as shown in FIG. 5a. The long stroke stage part 506 and the short stroke stage part 502 may be located in either the first positioning device PM or the second positioning device PW or both as depicted in FIG. 1. The long stroke stage part 506 may have a U-shaped cross-sectional shape. The long stroke stage part 506 may comprise a bottom portion 518 and two elongated portions 510, 512. The two elongated portion 510, 512 are located above the bottom portion 518 and are parallel to the short stroke stage part 502. A recess 520 may be formed by the bottom portion 518 and the two elongated portion 510, 512.

The lithographic apparatus may further comprise a guiding element 513 located between the short stroke stage part 502 and the long stroke stage part 506. The guiding element 513 may comprise a first elongated portion 514 and a second elongated portion 516. The guiding element 513 may have a U-shaped cross-sectional shape. In an embodiment, the guiding element 513 may be located inside the recess 520.

In FIG. 5b, the actuator 500 may work in a failure mode. When the mode of the lithographic apparatus is switched from the operation mode into the failure mode, the short stroke stage part 502 may be forced to move toward the recess 520 via the guiding element 513 as shown in FIG. 5b. The short stroke stage part 502 may be landed onto the bottom portion 518 of the long stroke stage part 506. The first elongated portion 514 of the guiding element 513 may be inserted between the elongated portion 510 of the long stroke stage part 506 and the short stroke stage part 502. The second elongated portion 516 of the guiding element 513 may be inserted between the elongated portion 512 of the long stroke stage part 506 and the short stroke stage part 502. The gap between the mover and the stator may be reduced by the insertion of the guiding element 513 between the long stroke stage part 506 and the short stroke stage part 502. Thus, an impact force generated between the mover and the stator during the failure mode may be reduced.

In an embodiment of the invention, there is provided a method for protecting an actuator of a lithographic apparatus from a crash, the actuator comprising a first part and a second part configured to move relatively to the first part, a gap located between the first part and the second part having a length defined as the distance between the first and the second part. The method may comprise the procedures of positioning an energy absorbing element outside the gap when the apparatus is in an operation mode, and absorbing energy with the energy absorbing element when the apparatus is in a failure mode. The first part may comprise a long stroke stage part and a stator located on the long stroke stage part. The second part may comprise a short stroke stage part and a mover located on the short stroke stage part. The energy absorbing element may comprise any elements having energy absorbing characteristics as described hereinabove.

In an embodiment, the method for protecting an actuator of a lithographic apparatus from a crash may further comprise moving an inserting element inside the gap when the apparatus is in the failure mode.

In an embodiment there is provided a lithographic apparatus comprising a system comprising a first part, a second part and an energy absorbing element. The second part is configured to move relatively to the first part. The system has a gap located between the first part and the second part during an operation mode of the system. The energy absorbing element is for absorbing energy between the first part and the second part when the first part and the second part crash onto each other in a failure mode of the system. The energy absorbing element is outside the gap.

The system may be an actuator comprising a stator and a mover. The actuator is configured to generate a force between the stator and the mover for moving the first part relative to the second part. The first part may comprise the stator. The second part may comprise the mover. The gap may be located between the stator and the mover.

The first part may comprise a first body, wherein the stator is moveable relative to the first body. The energy absorbing element may be connected between the stator and the first body.

The stator may comprise a first side facing the mover. The energy absorbing element may be connected to a side of the stator other than the first side. The energy absorbing element may be connected to a side of the stator opposite to the first side of the stator.

The lithographic apparatus may further comprise a guiding element for guiding the stator relative to the first body to move in a predetermined direction.

The lithographic apparatus may further comprise an adjusting element for adjusting the position of the stator with respect to the first body.

The lithographic apparatus may comprise a long stroke stage comprising the first part, and a short stroke stage comprising the second part.

The lithographic apparatus may comprise a projection system for projecting a radiation beam onto a substrate, and a positioning device comprising the system for positioning the substrate relative to the projection system. The second part may comprise a substrate table for holding the substrate.

The lithographic apparatus may comprise an inserting element configured to be inserted in the gap so as to contact the first part and/or the second part when the lithographic apparatus is in the failure mode.

The lithographic apparatus may comprise a holding element for holding the inserting element at a position outside the gap when the lithographic apparatus is in the operation mode and for releasing the inserting element when the lithographic apparatus is in the failure mode.

The lithographic apparatus may further comprise a gas bag for absorbing energy when the lithographic apparatus is in the failure mode.

In an embodiment there is provided a method for protecting an actuator of a lithographic apparatus from a crash. The actuator has a stator and a mover so as to generate a force between the stator and the mover. The lithographic apparatus comprises a first part and a second part configured to move relatively to the first part. The first part comprises the stator, a first body and an energy absorbing element between the stator and the first body. The second part comprises the mover. The lithographic apparatus has a gap located between the stator and the mover in an operation mode. The method comprises crashing the stator and the mover onto each other in a failure mode, and absorbing energy with the energy absorbing element by moving the stator relative to the first body.

The method may further comprise moving an inserting element inside the gap when the lithographic apparatus is crashing.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

What is claimed is:

1. A stage system comprising:
   a long stroke stage including a first part, the first part comprising a stator;
   a short stroke stage including a second part configured to move relatively to the first part, the second part comprising a mover, wherein the stage system has a gap located between the stator and the mover during an operation mode of the stage system, and wherein the stage system is configured to generate a force between the stator and the mover for moving the mover relative to the stator;
   an energy absorbing element for absorbing energy between the stator and the mover when the stator and the mover crash onto each other in a failure mode of the stage system, wherein the energy absorbing element is outside the gap, and
   an inserting element configured to be inserted in the gap so as to contact the stator and/or the mover when the stage system is in the failure mode.

2. The stage system according to claim 1, wherein the first part comprises a first body, wherein the stator is moveable relative to the first body, wherein the energy absorbing element is connected between the stator and the first body.

3. The stage system according to claim 2, wherein the stator comprises a first side facing the mover, and the energy absorbing element is connected to a side of the stator other than the first side.

4. The stage system according to claim 3, wherein the energy absorbing element is connected to a side of the stator opposite to the first side of the stator.

5. The stage system according to claim 2, further comprising a guiding element for guiding the stator relative to the first body to move in a predetermined direction.

6. The stage system according to claim 2, further comprising an adjusting element for adjusting the position of the stator with respect to the first body.

7. The stage system according to claim 1, further comprising a holding element for holding the inserting element at a position outside the gap when the stage system is in the operation mode and for releasing the inserting element when the stage system is in the failure mode.

8. The stage system according to claim 1, further comprising a gas bag for absorbing energy when the stage system is in the failure mode.

9. The stage system according to claim 1, further comprising a guide element for guiding a relative movement between the first part and the energy absorbing element in a predetermined direction during the failure mode of the system.

10. The stage system according to claim 1, wherein the long stroke stage includes a recess and wherein the stator is partially positioned in said recess.

11. A method for protecting an actuator of a lithographic apparatus from a crash, the actuator having a stator and a mover so as to generate a force between the stator and the mover, the lithographic apparatus comprising a long stroke stage including a first part and a short stroke stage including a second part configured to move relatively to the first part, the first part comprising the stator, a first body and an energy absorbing element between the stator and the first body, the second part comprising the mover, the lithographic apparatus having a gap located between the stator and the mover in an operation mode, the method comprising:
   crashing the stator and the mover onto each other in a failure mode;
   absorbing energy with the energy absorbing element by moving the stator relative to the first body, and
   moving an inserting element inside the gap when the lithographic apparatus is crashing.

12. The method according to claim 11, further comprising guiding, with a guiding element, a relative movement between the first part and the energy absorbing element in a predetermined direction during the failure mode.

13. The method according to claim 11, wherein the long stroke stage includes a recess and wherein the stator is partially positioned in said recess.

* * * * *